United States Patent [19]

Tamura

[11] Patent Number: 5,043,651
[45] Date of Patent: Aug. 27, 1991

[54] APPARATUS FOR DISPLAYING THE REMAINING CHARGE OF RECHARGEABLE BATTERY

[75] Inventor: Yoshiharu Tamura, Tokyo, Japan

[73] Assignee: NEC Corporation, Tokyo, Japan

[21] Appl. No.: 406,473

[22] Filed: Sep. 13, 1989

[30] Foreign Application Priority Data

Sep. 13, 1988 [JP] Japan .................................. 63-227384

[51] Int. Cl.$^5$ ......................... H02J 7/04; H01M 10/44
[52] U.S. Cl. ....................................... 320/43; 320/44; 320/48
[58] Field of Search ........................ 320/13, 14, 37, 38, 320/43, 44, 48

[56] References Cited

U.S. PATENT DOCUMENTS

| | | | |
|---|---|---|---|
| 4,677,363 | 6/1987 | Kopmann | 320/44 |
| 4,775,827 | 10/1988 | Ijntema et al. | 320/44 |
| 4,835,453 | 5/1989 | Munning Schmidt et al. | 320/13 |
| 4,849,681 | 7/1989 | Munning Schmidt et al. | 320/13 |

Primary Examiner—Hickey: R. J.

Attorney, Agent, or Firm—Sughrue, Mion, Zinn Macpeak & Seas

[57] ABSTRACT

An apparatus having a rechargeable battery and a battery voltage detector which detects the output voltage of the battery to produce a detection signal when the output voltage falls below a predetermined threshold level. A controller stores a battery capacity value and accumulates the discharge of the battery to produce an accumulated capacity value. The controller also calculates a difference between the stored capacity value and the accumulated capacity value. Using the difference, a display displays the remaining charge value of the battery thereon. If the difference exceeds a predetermined value at a time the controller receives the detection signal, the controller changes the stored capacity value to a new capacity value. Alternatively, the controller may change a rate of accumulating the battery discharge.

The apparatus may have a current detector for detecting a current flowing through the battery. The controller may accumulate the battery discharge based on the detected current.

28 Claims, 5 Drawing Sheets

APPARATUS FOR DISPLAYING THE REMAINING CHARGE OF RECHARGEABLE BATTERY

BACKGROUND OF THE INVENTION

The present invention relates to an apparatus for displaying a remaining charge of a rechargeable battery and, more particularly, to an apparatus for displaying the remaining battery charge based on an accumulated discharge value which is computed from operating current and time of battery usage.

In a conventional apparatus, a storage section stores a fixed battery capacity value which is usually a standard full charge capacity of a rechargeable battery A controller computes an accumulated discharge value based on the operating current and time of usage by electrical equipment to which power is supplied from the rechargeable battery. By comparing the stored battery capacity value with the accumulated discharge value, the remaining charge value of the battery can be obtained and displayed.

The conventional apparatus mentioned above has the following problems. Rechargeable batteries, such as a Ni-Cd alkaline battery, gradually decrease their full capacities as the number of recharging operations increases. Thus, the displayed charge value which is calculated using the stored, fixed battery capacity will differ from the actual remaining battery charge value. As a result, even though the displayed remaining charge value shows that the electrical equipment can still be operated by the battery, the equipment would suddenly stop for lack of battery energy.

Since different batteries have different capacities due to manufacturing variations, the standard capacity of batteries must be set to the minimum capacity among all batteries. This results in more charging operations, shortening the lives of batteries except for a battery having the minimum capacity.

Furthermore, the electrical equipment might use batteries having different capacities because of its limitation in size or in weight. In this case, the displayed remaining battery charge value which is calculated using the fixed battery capacity will also differ from the actual remaining battery charge value.

SUMMARY OF THE INVENTION

An object of the present invention is, therefore, to provide a generally improved apparatus which displays the remaining battery charge value and eliminates the above-mentioned problems.

Another object of the present invention is to provide a battery remaining charge display apparatus capable of making the displayed remaining battery charge substantially consistent with the actual remaining battery charge.

Yet another object of the present invention is to provide an apparatus having a so-called self-learning function which changes a stored variable, such as a battery capacity, based on actual battery conditions.

According to the present invention, there is provided an apparatus having a rechargeable battery and a battery voltage detector which detects the output voltage of the battery to produce a detection signal when the output voltage falls below a predetermined threshold level. A controller stores a battery capacity value and accumulates the discharge of the battery to produce an accumulated capacity value. The controller also calculates a difference between the stored capacity value and the accumulated capacity value. Using the difference, a display displays the remaining charge value of the battery. If the difference exceeds a predetermined value at a time the controller receives the direction signal, the controller changes the stored capacity value to a new capacity value. Alternatively, the controller may change the rate of accumulating the battery discharge.

The apparatus may have a current detector for detecting a current flowing through the battery. The controller may accumulate the battery discharge based on the detected current.

BRIEF DESCRIPTION OF THE DRAWINGS

The above and other objects, features and advantages of the present invention will become more apparent from the following description referring to the accompanying drawings, in which.

DETAILED DESCRIPTION OF THE PREFERRED EMBODIMENTS

Figure 1:
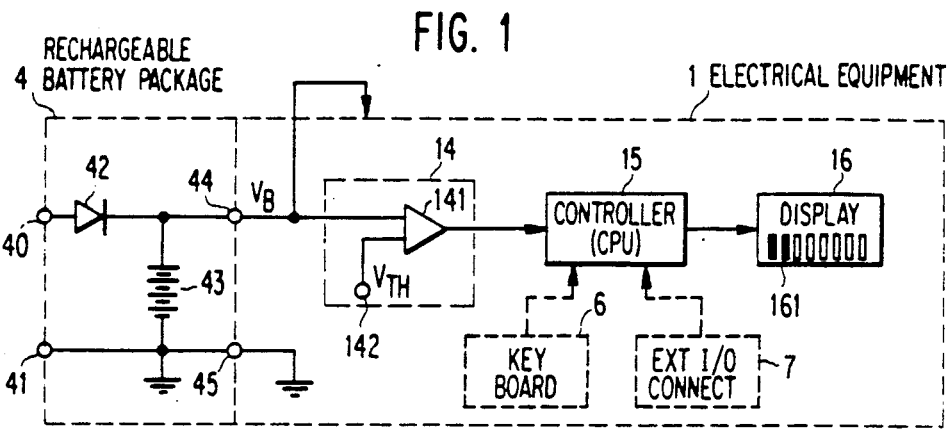
FIG. 1 is a schematic diagram showing an apparatus according to an embodiment of the present invention.

In FIG. 1, a battery package 4 is attached through terminals 44 and 45 to electrical equipment 1 which is powered by a rechargeable, or secondary, battery 43 in the package 4. The battery 43 is recharged by a battery charger (not shown) to be connected to terminals 40 and 41. The battery 43 may comprise a Ni-Cd alkaline battery. A diode 42 is inserted to prevent current from flowing from the battery 43 to the battery charger and to prevent short circuit damage to the battery 43.

The equipment 1 includes a battery voltage detector 14, a controller, or central processing unit (CPU) 15, a display 16 and other circuitry (not shown), such as circuitry used for a portable telephone. The controller 15 may be composed of a microprocessor. The detector 14 includes a voltage comparator 141 receiving the output voltage $V_B$ of the battery 43 and a threshold voltage $V_{TH}$ through the terminal 44 and a terminal 142, respectively. If the voltage $V_B$ falls below the threshold voltage $V_{TH}$, the detector 14 outputs a detection signal and provides it to the controller 15.

The controller 15 computes an accumulated discharge value (A) of the battery 43 in accordance with the following equation:

$$A = \sum_i a_i \cdot I_i \cdot t_i \qquad (1)$$

where $a_i$ is a weighting constant, $I_i$ is an operating current of the equipment 1 and $t_i$ is a time for which the equipment 1 operates at the current $I_i$. The discharge value changes depending on a value of a discharge current, because of the internal resistance of the battery 43. The weighting constant $a_i$ is employed to compensate for this discharge change. In general, if $I_1$ is greater than $I_2$, $a_1$ is also greater than $a_2$. It can be understood from the above equation (1) that an accumulating rate of the battery discharge can be changed by changing the weighting constant $a_i$.

The controller 15 stores therein the weighting constant $a_i$, the operating current $I_i$ and a battery capacity $C_f$ which are changeable based on the conditions of the battery 43 as described later. Also the controller 15 measures the operating time $t_i$ at the current $I_i$. After computing the accumulated discharge value A, the controller 15 calculates a subtraction value $C_R$ between the values $C_f$ and A as follows:

$$C_R = C_f - A$$

Using the value $C_R$, the controller 15 causes the display 16 to display the remaining battery charge value thereon. In the instant example, the display 16 has a bar graph 161.

The controller 15 changes the stored battery capacity $C_f$ or weighting constant $a_i$ in response to the detection signal from the battery voltage detector 14. This operation will now be described in detail with reference to FIGS. 2A to 2C. It is desirable that the displayed remaining charge value becomes zero shortly before the actual remaining charge becomes zero and to thereby have the user charge the battery 43 before the equipment 1 stops its operation due to the lack of power. This difference between the displayed and actual remaining charge values will hereinafter be referred to as a margin value $C_m$.

In this instance, the following is set:

$$C_f - A_T = C_{RT} \leq 0$$

where $A_T$ and $C_{RT}$ are the accumulated discharge value and the subtraction value, respectively, at a time the battery voltage $V_B$ falls below the threshold level $V_{TH}$. In other words, the margin value $C_m$ is selected to be equal to or less than zero ($C_m \leq 0$).

Figure 2A:
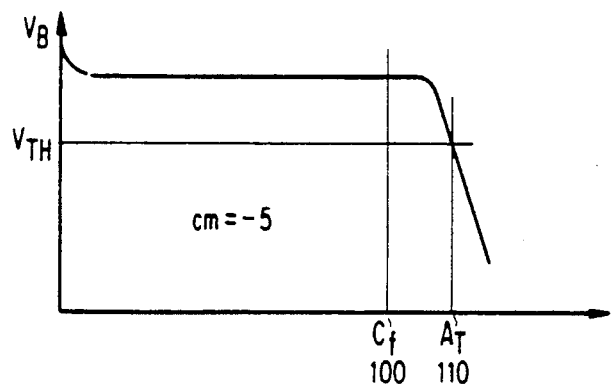
FIGS. 2A, 2B and 2C are graphs for explaining the operation of the FIG. 1 apparatus.

In FIG. 2A, the margin value $C_m$ is set to be $-5$, the battery capacity $C_f$ is 100 and the accumulated discharge value $A_T$ is 110. Thus, the subtraction value $C_{RT}$ is given as follows:

$$C_{RT} = C_f - A_T = 100 - 110 = -10.$$

Since this subtraction value $C_{RT}(-10)$ is less than the margin value $C_m(-5)$, the controller 15 adds no change to the battery capacity $C_f$. For the next calculation, the same battery capacity $C_f$ will be used.

Figure 2B:
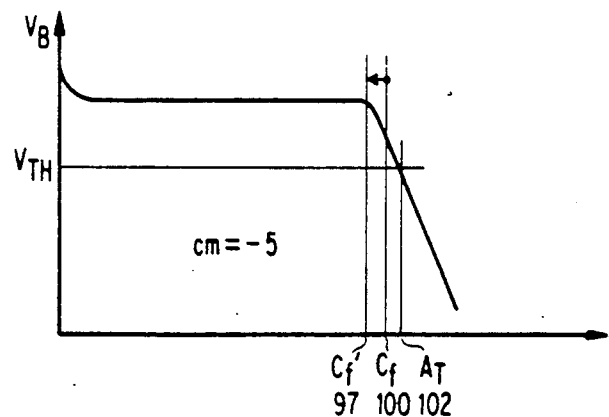

In FIG. 2B, the accumulated discharge value $A_T$ is calculated to be 102, which would be caused by the aging of the battery or other reasons. In this case, the subtraction value $C_{RT}$ is shown below.

$$C_{RT} = 100 - 102 = -2.$$

Since the subtraction value $C_{RT}(-2)$ is greater than the margin value $C_m(-5)$, the controller 15 changes the battery capacity $C_f$ to a new battery capacity $C_f$ which is calculated by an equation:

$$C_f = C_f - (C_{RT} - C_m) = 100 - (-2 - (-5)) = 97.$$

For the next calculation, the new battery capacity $C_f$ will be used.

Figure 2C:
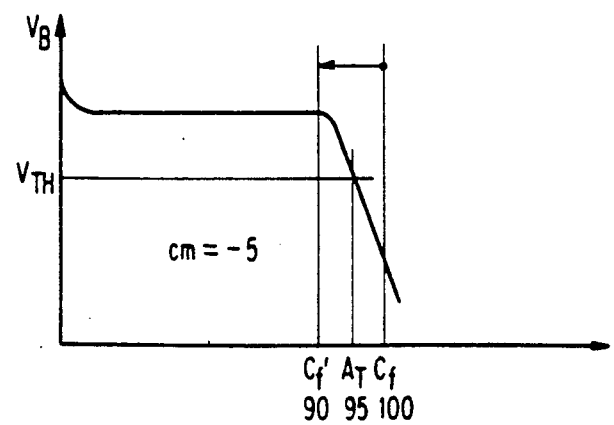

In FIG. 2C, a battery having a smaller battery capacity is used for the same equipment 1 in which the battery capacity $C_f$ is stored. In this case, if the controller 15 calculates an accumulated discharge value based on the stored battery capacity $C_f = 100$, the actual remaining charge value becomes zero before the displayed value becomes zero and thereby the equipment 1 cannot work properly, even though the displayed remaining charge value still indicates that the battery charge remains enough to operate the equipment 1. According to the present invention, on the other hand, the stored battery capacity $C_f$ will be changed based on the accumulated discharge value $A_T$. Since the value $A_T$ is 95, the subtraction value $C_{RT}$ is computed below.

$$C_{RT} = C_f - A_T = 100 - 95 = 5.$$

This value $C_{RT}(5)$ is greater than the margin value $C_m(-5)$. Thus, the battery capacity $C_f$ is changed to 90 using the equation $C_f = C_f - (C_{RT} - C_m)$. For the next use, the displayed remaining charge value properly suggests that the user charge the battery before the equipment 1 stops its operation.

Figure 3:
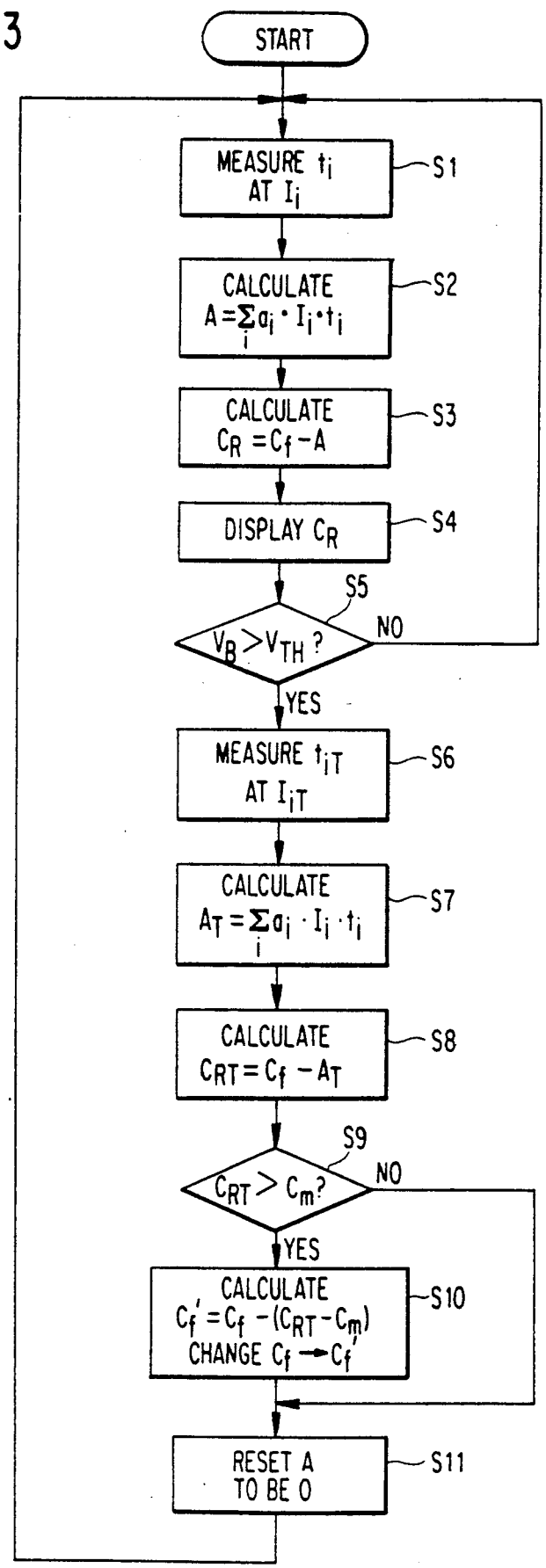
FIG. 3 is a flow chart showing the operation of the FIG. 2 apparatus.

Referring to FIG. 3, the operation of the controller 15 will be discussed in further detail. At step S1, the controller 15 measures an operating time $t_i$ at an operating current $I_i$. Then, the controller 15 calculates an accumulated discharge value in accordance with the equation (1) mentioned earlier. Next, the subtraction value $C_R$ is computed using a stored battery capacity $C_f$ and the accumulated discharge value A, at step S3. The computed value $C_R$ is displayed on the display 16 at step S4.

If the battery voltage $V_B$ is above the threshold level $V_{TH}$, however, the operation moves to step S6 at which an operating time $t_{iT}$ at an operating current $I_{iT}$ is measured. At step S7, the controller 15 calculates the accumulated discharge value $A_T$ at a time it receives a detection signal from the voltage detector 14. Using the stored battery capacity $C_f$ and calculated value $A_T$, the subtraction value $C_{RT}$ therebetween is calculated at Step S8.

If the value $C_{RT}$ is greater than the margin value $C_m$, the operation goes to step S10 at which a new battery capacity $C_f$, is calculated by the equation $C_f - (C_{RT} - C_m)$ and the capacity $C_f$ is changed to $C_f'$. Then, the accumulated charge value A is reset to zero at step S11. If the subtraction value $C_{RT}$ is smaller than the margin value $C_m$ at step S9, this step is followed by step S11.

Figure 4:
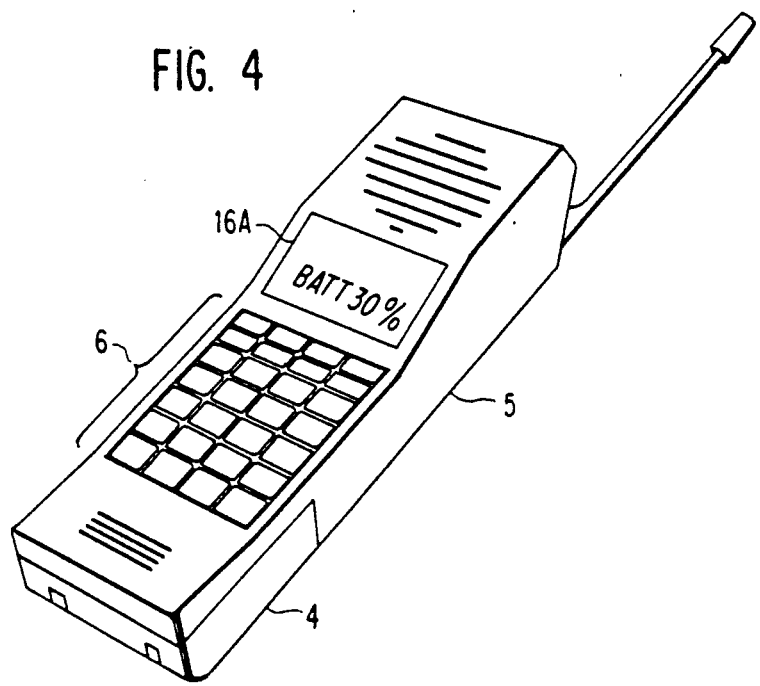
FIG. 4 is a perspective view of a hand-held mobile telephone embodying the present invention.

In FIG. 4, the present invention is embodied in a hand-held radio telephone 5. The battery package 4 is attached to the telephone 5. A display 16A displays the battery remaining charge thereon using characters like "BATT 30%" instead of the bar graph. The telephone 5 has a keyboard 6 which may be connected to the controller 15, as indicated by a broken line in FIG. 1. The telephone 5 also includes an external I/O connector 7 (see FIG. 1) which may be connected to the controller 15 and which receives a remotely transmitted control signal. Such equipment having a keyboard and an external I/O connector may have the following additional functions.

Figure 5A:
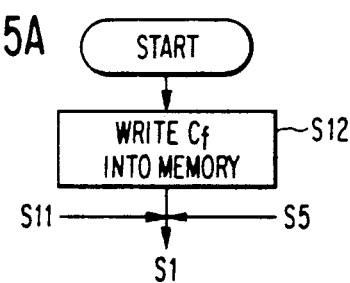
FIGS. 5A to 5F are flow charts showing modifications to the FIG. 1 apparatus.

(1) The battery capacity $C_f$ can manually be rewritten by a signal inputted through the keyboard 6 or can be remotely rewritten by the control signal. See FIG. 5A.

Figure 5D:
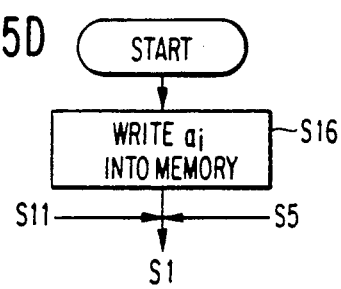
Figure 5B:
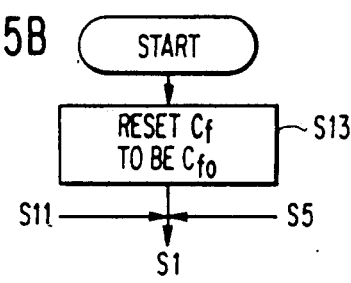

(2) The battery capacity $C_f$ or $C_{f'}$ can manually be reset to be a prescribed value $C_{fo}$ through the keyboard 6 or can be remotely reset by the control signal. See FIG. 5B.

(3) When the subtraction value $C_{RT}$ exceeds the margin value, $C_m$, the weighting constant $a_i$ can be changed to a new weighting constant $a_{i'}$ instead of changing the battery capacity $C_f$. See step S15 in FIG. 5C.

(4) In case of (3), the constant $a_{i'}$ is calculated by the following equation:

$$C_f + C_m = \sum_i a_{i'} \cdot I_i \cdot t_i.$$

Figure 5E:
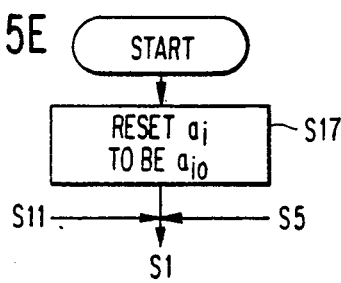
Figure 5C:
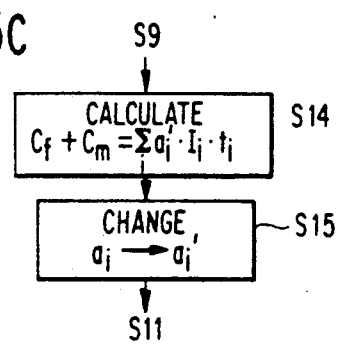

See FIG. 5C.

(5) In case of (3), the weighting constant $a_i$ can manually be written through the keyboard 6 or can remotely be rewritten by the control signal. See FIG. 5D.

(6) In case of (3), the weighting constant $a_i$ or $a_{i'}$ can manually be reset to a prescribed value $a_{io}$ through the keyboard 6 or can remotely be reset by the control signal. See FIG. 5E.

Figure 5F:
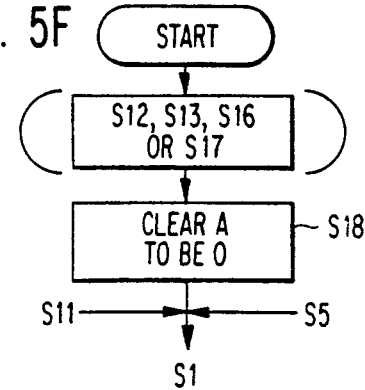

(7) The user can manually clear the accumulated charge value A to be 0 at a time when he starts to use the equipment 1 with a fully charged battery 43. In this case, step S11 need not be included in the flow chart of FIG. 3. See FIG. 5F.

When two batteries having different capacities are used or a brand-new battery and a used battery are alternatively used, the battery capacity $C_f$ or the weighting constant $a_i$ can properly be set to a prescribed value using the function (1) or (5) above. In addition, when a battery which is not fully charged is used, the battery capacity $C_f$ or the weighting constant $a_i$ can be reset to a prescribed value $C_{fo}$ or $a_{io}$ using the function (2) or (6). Otherwise, the value $C_f$ or $a_i$ would be changed to a smaller value which does not properly reflect the actual battery capacity.

It is important to decide a start time of operation of the apparatus with a fully charged battery. The simplest and most reliable way may be to manually clear the accumulated discharge value A to be zero in such a way as in case of (7). Alternatively, a first turning-on of a power switch of the equipment 1 receives a charge completion signal automatically sent from a battery charger which is to be connected to the equipment through the battery 43.

Figure 6:
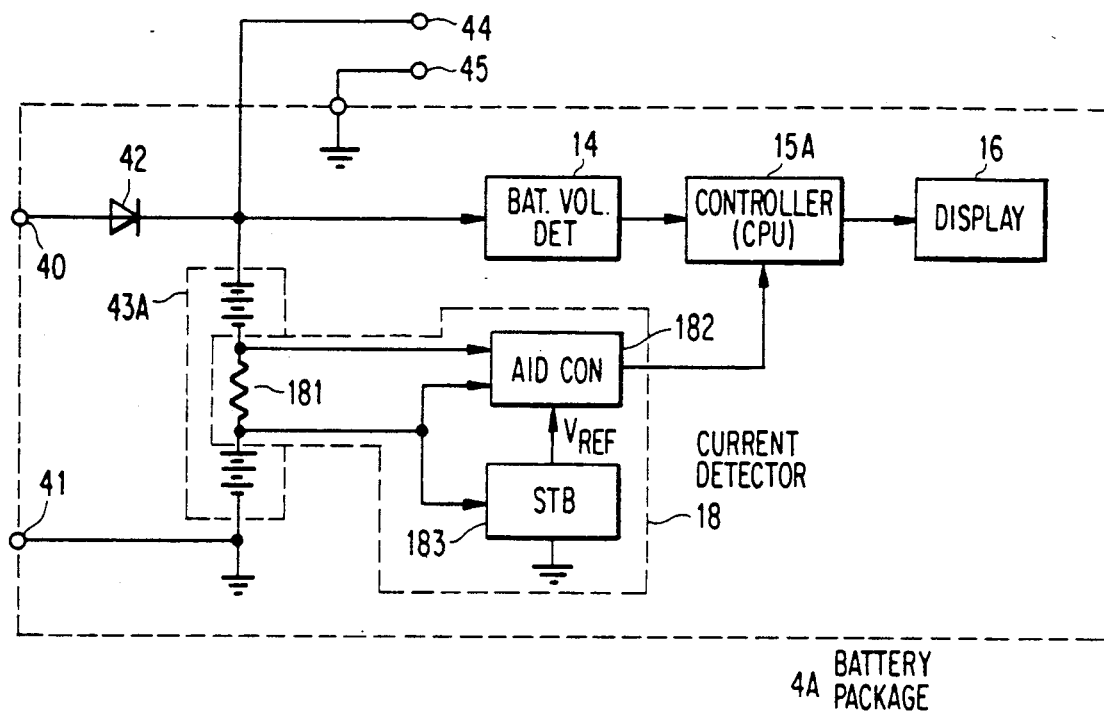
FIG. 6 is a schematic block diagram showing an apparatus according to another embodiment of the present invention.

In FIG. 6, the same numerals as those in FIG. 1 indicate the same elements as those in FIG. 1. A battery package 4A accommodates not only a battery 43A and a diode 42 but also a battery voltage detector 14, a controller 15A and a display 16 which in the FIG. 1 embodiment are included in the electrical equipment 1. In addition to the functions of controller 15, the controller 15A has additional functions described below. The battery package 4A has terminals 44 and 45 through which the battery 43A is electrically connected to electrical equipment. The package 4A further includes a current detector 18 having a current sensor resistor 181 contained in the battery 43A, an analog-to-digital (A/D) converter 182 and a voltage stabilizer 183.

Figure 8A:
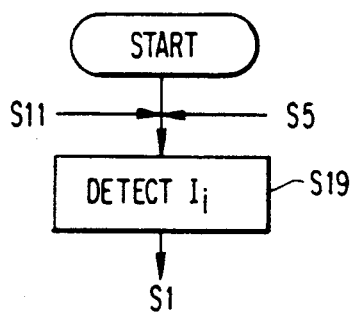
FIGS. 8A and 8B are flow charts showing the operation of the FIG. 6 apparatus.
Figure 8B:
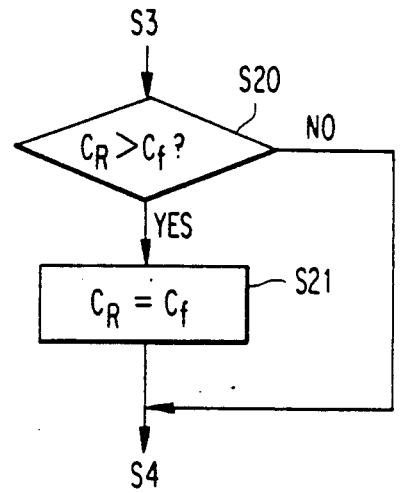

The resistor 181 senses a current flowing therethrough. The stabilizer 183 is connected to the battery 43A and supplies a stabilized reference voltage $V_{REF}$ to A/D converter 182. Using the reference voltage $V_{REF}$, A/D converter 182 converts the sensed analog current into a digital value and provides the digital value to the controller 15A as a detected current $I_i$ (see FIG. 8A). It is to be noted that the current detector 18 can detect not only a discharge current but also a charge current. Using the detected current $I_i$, the controller 15A calculates an accumulated discharge or charge value A and then computes a subtraction value $C_R = C_f - A$. This value $C_R$ correctly reflects the actual remaining battery charge, even if the charging operation has taken place before the completion of discharge. In this case, however, the accumulated discharge value may be negative, i.e., the value $C_R$ may exceed the battery capacity $C_f$. If so, the controller 15A sets the value $C_R$ to the value $C_f$ and displays it on the display 16 (see FIG. 8B).

Figure 7:
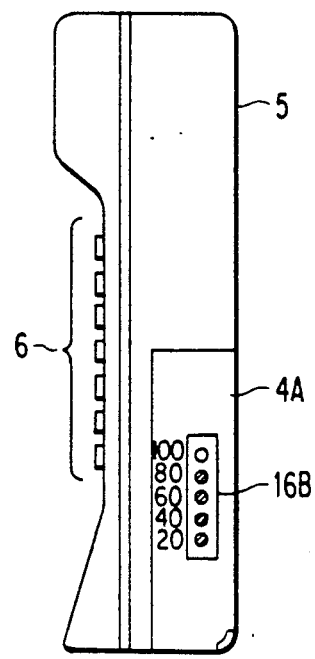
FIG. 7 is a side view of a hand-held mobile telephone incorporating the FIG. 6 apparatus therein.

In FIG. 7, the battery package 4A has the display 16B on a side wall thereof. The display 16B is composed of a plurality of light emitting diodes (LEDs). In the Figure, four LEDs are lit to indicate that 80% of charge remains in the battery.

Figure 9:
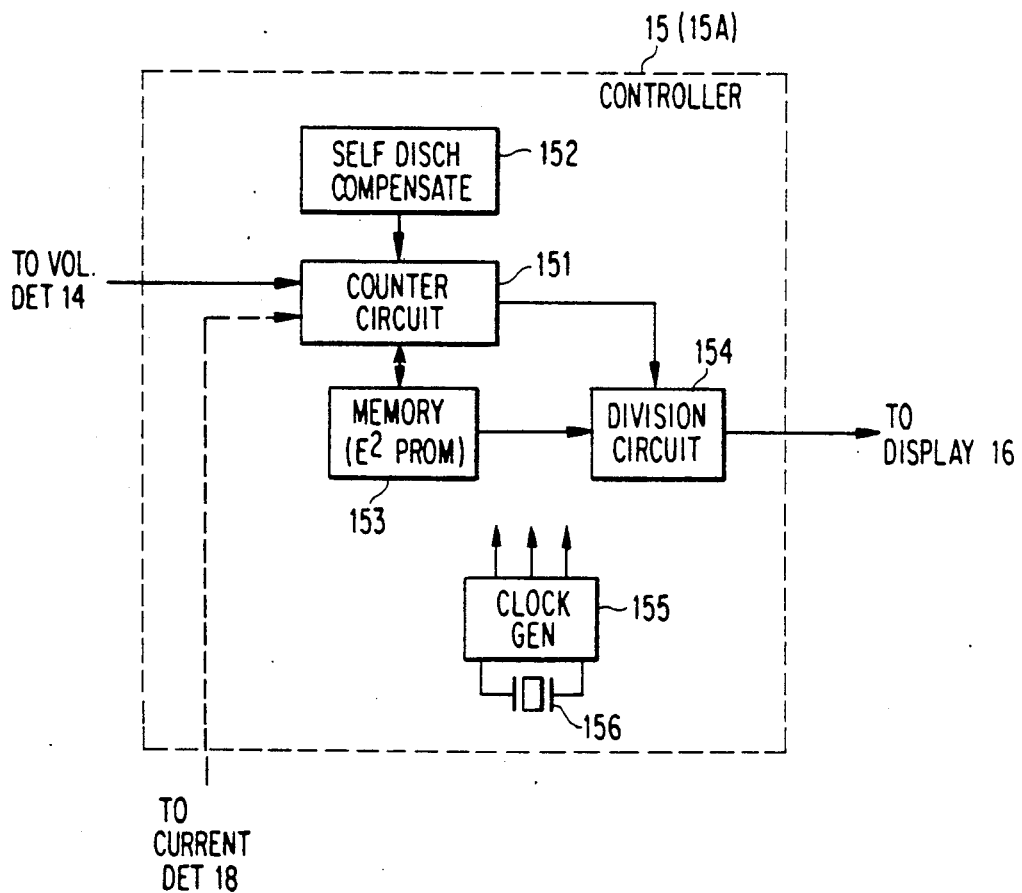
FIG. 9 is a block diagram showing the controller used in the FIG. 1 or FIG. 6 apparatus.

In FIG. 9, the controller 15 or 15A includes a counter circuit 151, a self discharge compensation (SDC) circuit 152, a memory 153, a division circuit 154, a clock generator 155 and a crystal oscillator element 156. The SDC circuit 152 produces an SDC signal indicating a value of self discharge of the battery 43 or 43A. The memory 153 stores and rewrites the battery capacitor $C_f$ or the weighting constant $a_i$. The memory 153 may be an electrically erasable programmable read-only memory ($E^2$-PROM).

The clock generator 155 generates clock pulses in cooperation with the element 156 and provides them to various circuits of controller 15 or 15A. The counter circuit 151 counts up an accumulated charge value A based on a fixed or detected current $I_i$ and subtracts the value A from the value $C_f$ stored in memory 153. The resultant $C_R$ is supplied to the division circuit 154 which divides the value $C_R$ by the value $C_f$. The divided value $C_R/C_f$ is supplied to the display 16 to be displayed thereon. When receiving a detection signal from the voltage detector 14, the counter circuit 151 produces a value $C_{RT} - C_m$ from the value $C_f$ to produce a new capacity $C_{f'}$. The counter circuit 153 may be comprised of several counters and gates.

What is claimed is:

1. An apparatus for monitoring the residual capacity of a battery comprising:
   means for detecting the output voltage of a battery and for producing a detection signal when said output voltage falls below a predetermined threshold level;
   means for storing a first value;
   means for accumulating the discharge of said battery to produce a second value;
   first means for calculating a difference between said first and second values to produce a difference value;
   means responsive to said difference value for displaying the remaining charge value of said battery;
   second means responsive to said detection signal for providing said second value to said calculating means; and
   means for changing either said first value or an accumulating rate of said accumulating means when said difference value is higher than a predetermined value.

2. An apparatus as claimed in claim 1, wherein said storing means comprises means for storing a battery capacity $C_f$ of said battery as said first value, and wherein said accumulating means comprises third means for calculating said second value (A) according to an equation;

$$A = \sum_i a_i \cdot I_i \cdot t_i,$$

where: $a_i$ is a weighting value, $I_i$ is an operating current and $t_i$ is an operating time at said current $I_i$, and wherein said first means comprises means for subtracting said second value A from said first value $C_f$ to produce said difference value $C_R = C_f - A$.

3. An apparatus as claimed in claim 2, further comprising:
   current detector means for detecting a current flowing through said battery to produce a detected current value; and
   fourth means for providing said detected current value to said third means as said operating current $I_i$.

4. An apparatus as claimed in claim 3, wherein said current detector means comprises:
   a resistor connected in series with said battery;
   means receiving a voltage from said battery for producing a stabilized reference voltage; and
   means connected to said resistor and responsive to said reference voltage for detecting said current flowing through said resistor to produce a detected current, for converting said detected current into a digital value and for producing said digital value as said detected current value.

5. An apparatus as claimed in claim 3, further comprising package means for accommodating said battery, said detecting means, said accumulating means, said storing means, said first and second means, said changing means, said current detector means and said fourth means, said displaying means being attached to said package means.

6. An apparatus for monitoring residual capacity of a battery comprising:
   means for storing a first value;
   first means for producing a first detection signal when the output voltage of a battery falls below a predetermined threshold value;
   means for accumulating the discharge of said battery to produce an accumulated discharge value;
   means responsive to said first value and said accumulated value for calculating the remaining charge of said battery to produce a remaining charge value;
   means for displaying said remaining charge value;
   means responsive to said first detection signal for comparing said remaining charge value with a predetermined value to produce a change signal when said remaining charge value exceeds said predetermined value; and
   means responsive to said change signal for changing either said first value or an accumulating rate of said accumulating means.

7. An apparatus as claimed in claim 6, further comprising a rechargeable battery.

8. An apparatus as claimed in claim 7, wherein said rechargeable battery comprises a Ni-Cd alkaline battery.

9. An apparatus as claimed in claim 6, wherein said first means comprises voltage comparator means for comparing the output voltage of said battery and said predetermined threshold value to produce said first detection signal when said output voltage falls below said predetermined threshold value.

10. An apparatus as claimed in claim 6, wherein said displaying means comprises a bar-graph type display.

11. An apparatus as claimed in claim 6, further comprising means for detecting a current flowing through said battery to produce a second detection signal, wherein said calculating means comprises means responsive to said first value, said accumulated discharge value and said second detection signal for calculating said remaining charge of said battery to produce said remaining charge value.

12. An apparatus comprising:
   a battery adapted to power electrical equipment;
   a display;
   means for storing a battery capacity value $C_f$;
   means for detecting the output voltage of said battery to produce a detection signal when said output voltage falls below a predetermined threshold value;
   first means for calculating an accumulated discharge value A of said battery by an equation $$A = \sum_i a_i \cdot I_i \cdot t_i$$

where $a_i$ is a weighting constant, $I_i$ is an operating current of said equipment and $t_i$ is a time for which said equipment operates at said current $I_i$;
   second means for calculating a difference $C_R$ between said values $C_f$ and A, $C_R = C_f - A$;
   means responsive to said difference $C_R$ for displaying on said display the remaining charge value of said battery;
   means responsive to said detection signal for comparing said difference with a predetermined value $C_m$ to produce a change signal when said difference is equal to or greater than said value $C_m$; and
   means responsive to said change signal for replacing either said value $C_f$ or said constant $a_i$ with a new capacity value $C_f$ or a new weighting constant $a_i$.

13. An apparatus as claimed in claim 12, wherein said equipment comprises a radio telephone.

14. An apparatus comprising:
   a battery adapted to provide power to electrical equipment;
   voltage detector means for producing a detection signal when the output voltage of said battery falls below a predetermined threshold value;
   means for storing a first value;
   means for calculating a first remaining charge value of said battery based on said first value;
   display means for displaying said first remaining charge value;
   means responsive to said detection signal for calculating a second remaining charge value of said battery based on said first value; and
   means for changing said first value when said second remaining charge value exceeds a predetermined value.

15. An apparatus as claimed in claim 14, wherein said first value is a battery capacity $C_f$ of said battery, and wherein said apparatus further comprises:

means for measuring a time $t_i$ for which said equipment operates at a first current $I_i$;

means for calculating a first accumulated discharge value A of said battery by an equation of $$A = \sum_i a_i \cdot I_i \cdot t_i$$

where $a_i$ is a weighting constant;

means for calculating a difference between said values $C_f$ and A to produce said first remaining charge value $C_R = C_f - A$;

means responsive to said detection signal for measuring a time $t_{iT}$ for which said equipment operates at a second current $I_{iT}$ and for calculating a second accumulated discharge value $A_T$ of said battery by an equation of $$A_T = \sum_i a_i \cdot I_i \cdot t_i$$

means for calculating a difference between said values $C_f$ and $A_T$ to produce said second remaining charge value $C_{RT} = C_f - A_T$;

means for comparing said value $C_{RT}$ with said predetermined value ($C_m$) to produce a change signal when said value $C_{RT}$ exceeds said value $C_m$; and means responsive to said change signal for changing said value $C_f$ to a new value $C_f$.

16. An apparatus as claimed in claim 15, further comprising means for manually writing said value $C_f$ into said storing means.

17. An apparatus as claimed in claim 15, further comprising means for manually resetting said value $C_f$ to be a value $C_{fo}$.

18. An apparatus as claimed in claim 14, wherein said first value is a weighting constant $a_i$, and wherein said storing means further comprises means for storing a battery capacity value $C_f$ of said battery, and wherein said apparatus further comprises:

means for measuring a time $t_i$ for which said equipment operates at a first current $I_i$;

means for calculating a first accumulated discharge value A of said battery by an equation of $$A = \sum_i a_i \cdot I_i \cdot t_i$$

where $a_i$ is a weighting constant;

means for calculating a difference between said values $C_f$ and A to produce said first remaining charge value $C_R = C_f - A$;

means responsive to said detection signal for measuring a time $t_{iT}$ for which said equipment operates at a second current $I_{iT}$ and for calculating a second accumulated discharge value $A_T$ of said battery by an equation of $$A_T = \sum_i a_i \cdot I_i \cdot t_i$$

means for calculating a difference between said values $C_f$ and $A_T$ to produce said second remaining charge value $C_{RT} = C_f - A_T$;

means for comparing said value $C_{RT}$ with said predetermined value ($C_m$) to produce a change signal when said value $C_{RT}$ exceeds said value $C_m$; and means responsive to said change signal for changing said value $C_f$ to a new value $C_f$.

19. An apparatus as claimed in claim 18, further comprising means for manually writing said value $a_i$ into said storing means.

20. An apparatus as claimed in claim 18, further comprising means for manually resetting said value $a_i$ to a value $a_{io}$.

21. An apparatus as claimed in claim 15, further comprising means for manually resetting said first accumulated discharge value A to zero.

22. An apparatus as claimed in claim 18, further comprising means for manually resetting said first accumulated discharge value A to zero.

23. An apparatus as claimed in claim 15, further comprising means for detecting a current in said battery to produce a current detection signal as either said first current $I_i$ or second current $I_{it}$.

24. An apparatus as claimed in claim 18, further comprising means for detecting a current flowing in said battery to produce 3 a current detection signal as either said first current $I_i$ or second current $I_{it}$.

25. A method of displaying a remaining charge value of a battery adapted to power electrical equipment, comprising the following steps of:

detecting the output voltage of said battery to produce a voltage detection signal when said output voltage falls below a predetermined threshold value;

storing a first value;

calculating a first remaining charge value of said battery based on said first value;

displaying said first remaining charge value;

responsive to said voltage detection signal, calculating a second remaining charge value of said battery based on said first value; and changing said first value when said second remaining charge value exceeds a predetermined value.

26. A method as claimed in claim 25, wherein said step of storing comprises the step of storing a battery capacity $C_f$ of said battery as said first value, and wherein said method further comprises the steps of:

measuring times, $t_i$, for which said equipment operates at first currents $I_i$;

means for calculating a first accumulated discharge value A of said battery by an equation of $$A = \sum_i a \cdot I_i \cdot t_i$$

where $a_i$ is a weighting constant;

calculating a difference between said values $C_f$ and A to produce said first remaining charge value $C_R = C_f - A$;

responsive to said detection signal, measuring a time $t_{iT}$ for which said equipment operates at a second current $I_{iT}$ and calculating a second accumulated discharge value $A_T$ of said battery according to an equation $$A_T = \sum_i a_i \cdot I_i \cdot t_i$$

calculating a difference between said values $C_f$ and $A_T$ to produce said second remaining charge value $C_{RT} = C_f - A_T$;

comparing said value $C_{RT}$ with said predetermined value ($C_m$) to produce a change signal when said value $C_{RT}$ exceeds said value $C_m$; and responsive to said change signal, changing said value $C_f$ to a new value $C_f$.

27. A method of displaying a remaining charge value of a battery adapted to power equipment, comprising the following steps of:

detecting the output voltage of said battery to produce a first detection signal when said output voltage falls below a predetermined threshold level;

storing a first value;

accumulating the discharge of said battery to produce a second value;

subtracting said second value from said first value to produce a third value;

responsive to said third value, displaying the remaining charge value of said battery;

responsive to said first detection signal, changing either said first value or an accumulating rate at said step of accumulating when said third value exceeds a predetermined value.

28. A method as claimed in claim 27, further comprising the step of:

detecting a current flowing through said battery to produce a second detection signal;

wherein said step of accumulating comprises the step of:

accumulating said discharge of said battery based on said second detection signal to produce said second value.

* * * * *

UNITED STATES PATENT AND TRADEMARK OFFICE
CERTIFICATE OF CORRECTION

PATENT NO. : 5,043,651

DATED : August 27, 1991

INVENTOR(S) : Yoshiharu Tamura

It is certified that error appears in the above-identified patent and that said Letters Patent is hereby corrected as shown below:

Col. 4, line 4, delete the first occurence of "$C_f$" and insert --$C_{f_1}$--;

Col. 4, line 6, delete "$C_f$" and insert --$C_{f_1}$--;

Col. 4, line 27, delete the first occurence of "$C_f$" and insert --$C_{f_1}$--;

Col. 4, line 52, delete "$C_f$" and insert --$C_{f_1}$--;

Col. 5, line 6, delete the second occurence of "$C_f$" and insert --$C_{f_1}$--;

Col. 6, line 47, delete "$C_f$" and insert --$C_{f_1}$--;

Col. 7, line 18, delete "$C_j$" and insert --$C_f$--;

UNITED STATES PATENT AND TRADEMARK OFFICE
CERTIFICATE OF CORRECTION

PATENT NO. : 5,043,651

DATED : August 27, 1991

INVENTOR(S) : Yoshiharu Tamura

It is certified that error appears in the above-identified patent and that said Letters Patent is hereby corrected as shown below:

Col. 9, line 33, delete the second occurence of "$C_f$" and insert --$C_{f'}$--;

Col. 10, line 5, delete the second occurence of "$C_f$" and insert --$C_{f'}$--;

Col. 10, line 24, delete "3";

Col. 11, line 8, delete the second occurence of "$C_f$" and insert --$C_{f'}$--.

Signed and Sealed this

Twentieth Day of April, 1993

Attest:

MICHAEL K. KIRK

Attesting Officer     Acting Commissioner of Patents and Trademarks